(12) United States Patent
Shieh et al.

(10) Patent No.: US 9,117,918 B2
(45) Date of Patent: Aug. 25, 2015

(54) METAL OXIDE TFT WITH IMPROVED SOURCE/DRAIN CONTACTS

(71) Applicants: Chan-Long Shieh, Paradise Valley, AZ (US); Gang Yu, Santa Barbara, CA (US); Fatt Foong, Goleta, CA (US)

(72) Inventors: Chan-Long Shieh, Paradise Valley, AZ (US); Gang Yu, Santa Barbara, CA (US); Fatt Foong, Goleta, CA (US)

(73) Assignee: CBRITE Inc., Goleta, CA (US)

( * ) Notice: Subject to any disclaimer, the term of this patent is extended or adjusted under 35 U.S.C. 154(b) by 0 days.

(21) Appl. No.: 14/175,521

(22) Filed: Feb. 7, 2014

(65) Prior Publication Data

US 2014/0151694 A1 Jun. 5, 2014

Related U.S. Application Data

(62) Division of application No. 13/155,749, filed on Jun. 8, 2011, now Pat. No. 8,679,905.

(51) Int. Cl.
*H01L 29/786* (2006.01)
*H01L 21/428* (2006.01)
*H01L 29/45* (2006.01)
*H01L 29/66* (2006.01)

(52) U.S. Cl.
CPC .......... *H01L 29/7869* (2013.01); *H01L 21/428* (2013.01); *H01L 29/45* (2013.01); *H01L 29/66969* (2013.01); *H01L 29/78606* (2013.01)

(58) Field of Classification Search
CPC .................................................. H01L 29/7869
USPC ............................................ 257/43, E21.618
See application file for complete search history.

(56) References Cited

U.S. PATENT DOCUMENTS

| 5,576,555 | A * | 11/1996 | Yamanobe et al. ............ 257/53 |
| 5,587,591 | A * | 12/1996 | Kingsley et al. ............... 257/59 |
| 8,202,771 | B2 * | 6/2012 | Nagae et al. .................. 438/161 |
| 2002/0125533 | A1 * | 9/2002 | Satou et al. .................... 257/347 |
| 2006/0049403 | A1 * | 3/2006 | Byun et al. ...................... 257/59 |
| 2008/0004391 | A1 * | 1/2008 | Chan et al. .................... 524/445 |
| 2008/0032236 | A1 * | 2/2008 | Wallace et al. ............... 430/319 |
| 2008/0044684 | A1 * | 2/2008 | Chan et al. .................... 428/626 |
| 2009/0140053 | A1 * | 6/2009 | Yamazaki et al. ............ 235/492 |
| 2009/0214764 | A1 * | 8/2009 | Li et al. ........................ 427/98.4 |
| 2009/0294765 | A1 * | 12/2009 | Tanaka et al. .................. 257/43 |
| 2010/0006824 | A1 * | 1/2010 | Hong et al. ..................... 257/24 |
| 2010/0025088 | A1 * | 2/2010 | Kamata et al. ................ 174/256 |
| 2010/0224867 | A1 * | 9/2010 | Heuft et al. ..................... 257/40 |
| 2011/0062460 | A1 * | 3/2011 | Ohmi et al. ..................... 257/88 |
| 2011/0177696 | A1 * | 7/2011 | Yano et al. .................... 438/779 |
| 2013/0077011 | A1 * | 3/2013 | Yamazaki et al. ............. 349/43 |
| 2013/0082256 | A1 * | 4/2013 | Yamazaki ....................... 257/43 |

* cited by examiner

*Primary Examiner* — Joseph C Nicely
(74) *Attorney, Agent, or Firm* — Robert A. Parsons; Michael W. Goltry; Parsons & Goltry (57) ABSTRACT

A method of forming ohmic source/drain contacts in a metal oxide semiconductor thin film transistor includes providing a gate, a gate dielectric, a high carrier concentration metal oxide semiconductor active layer with a band gap and spaced apart source/drain metal contacts in a thin film transistor configuration. The spaced apart source/drain metal contacts define a channel region in the active layer. An oxidizing ambient is provided adjacent the channel region and the gate and the channel region are heated in the oxidizing ambient to reduce the carrier concentration in the channel area. Alternatively or in addition each of the source/drain contacts includes a very thin layer of low work function metal positioned on the metal oxide semiconductor active layer and a barrier layer of high work function metal is positioned on the low work function metal.

29 Claims, 4 Drawing Sheets

TABLE 1 : CHEMICAL NAME AND STRUCTURE OF LAYER 39:

| CHEMICAL NAME | SHORT NAME | CHEMICAL STRUCTURE |
|---|---|---|
| POLY (METHYL METHACRYLATE) | (PMMA) |  |
| POLYMETHYLGLUTARIMIDE | (PMGI) |  |
| POLYIMIDE | (PI) |  |
| POLYMETHYLENE OXIDE | (PEO) |  |
| POLYVINYL ALCOHOL | (PVA) |  |
| POLYDIMETHYLSILOXANE | (PDMS) |  |
| POLYETHYLENE TEREPHTHALATE | (PET) |  |
| POLYETHYLENE NAPHTHALATE | (PEN) | |

FIG. 7

METAL OXIDE TFT WITH IMPROVED SOURCE/DRAIN CONTACTS

CROSS-REFERENCE TO RELATED APPLICATIONS

This application is a divisional application of currently pending U.S. application Ser. No. 13/155,749, filed 8 Jun. 2011.

FIELD OF THE INVENTION

This invention generally relates to metal oxide semiconductor films in TFTs and more specifically to forming an active layer with areas of different carrier densities whereby the source/drain contacts of the metal oxide film are improved.

BACKGROUND OF THE INVENTION

In the prior art, amorphous silicon (a-Si) thin film transistors are formed by depositing a first layer of a-Si semiconductor material over a gate and gate insulator layer and then depositing a layer of highly doped silicon (e.g. $n^+$layer) on top of the first layer. Metal contacts for the source and drain are then formed on the highly doped layer defining a channel area in the first a-Si layer between the contacts. The highly doped layer over the channel area can then be etched away so as not to adversely affect the channel area. The low mobility in the a-Si TFT channel makes the device less demanding on contact resistance. The metal contacts formed on the highly doped area provide a low resistance (ohmic) contact.

In metal oxide thin film transistors (MOTFT) the metal contacts are formed directly on the metal oxide semiconductor layer. That is the metal oxide semiconductor material is the same under the metal contacts as it is in the channel area. For MOTFTs the lack of an $n^+$ layer and a higher bandgap make it harder to provide a good ohmic contact. Furthermore, the high mobility of the metal oxide semiconductor material demands a lower contact resistance than in a-Si TFTs. Without a good, low resistance contact, hereinafter referred to as an ohmic contact, the high mobility of the metal oxide semiconductor material can be masked by the contact resistance. However, ohmic contacts in MOTFTs have been virtually unknown to date or are very difficult to form and/or retain.

It would be highly advantageous, therefore, to remedy the foregoing and other deficiencies inherent in the prior art.

Accordingly, it is an object of the present invention to provide new and improved source/drain metal contacts in a MOTFT.

It is another object of the present invention to provide new and improved source/drain metal contacts in a MOTFT that form a low resistance ohmic contact.

It is another object of the present invention to provide a new and improved source/drain metal contacts in a MOTFT that are relatively easy and inexpensive to fabricate.

It is also an object of the present invention to provide a process for fabricating a MOTFT from a uniform metal oxide film of which portions in contact with the source/drain metal contacts have a carrier concentration greater than the carrier concentration in the channel area.

It is also an object of the present invention to provide an insulating, passivation layer shielding the channel area, which passivation layer serves as a chemical barrier under TFT storage/operation conditions and during TFT fabrication following metal oxide semiconductor layer formation. The same passivation layer also possesses sufficient mobility to oxygen and hydrogen at an annealing temperature above its glassy temperature.

It is another object of the present invention to provide an insulating, passivation layer shielding the channel area, which passivation layer includes oxygen containing groups, and which serves as an oxygen source at annealing temperatures and serves as a chemical barrier at TFT storage/operation temperatures.

SUMMARY OF THE INVENTION

Briefly, the desired objects of the instant invention are achieved in accordance with a method of forming an active layer for a TFT with areas of different carrier densities. The method includes the step of providing a substrate with a gate, a layer of gate dielectric adjacent the gate, and a layer of high carrier concentration metal oxide semiconductor material positioned on the gate dielectric opposite the gate. The method further includes the step of oxidizing a channel portion of the layer of metal oxide semiconductor material aligned with the gate to reduce the carrier concentration of the channel portion. Contact portions on both sides of the channel portion are retained at the high carrier concentration.

To further achieve the desired objects of the instant invention, provided is a method of forming ohmic source/drain contacts in a metal oxide semiconductor thin film transistor including providing a gate, a gate dielectric, a high carrier concentration metal oxide semiconductor active layer with a band gap and spaced apart source/drain metal contacts in a thin film transistor configuration. The spaced apart source/drain metal contacts define a channel region in the active layer. An oxidizing ambient is provided adjacent the channel region and the gate and the channel region are heated in the oxidizing ambient to reduce the carrier concentration in the channel area. Alternatively or in addition each of the source/drain contacts includes a very thin layer of low work function metal positioned on the metal oxide semiconductor active layer and a barrier layer of high work function metal is positioned on the low work function metal.

The desired objects of the instant invention are further achieved in accordance with one embodiment thereof wherein a metal to metal oxide low resistance ohmic contact in a metal oxide semiconductor thin film transistor includes a gate, a gate dielectric, a high carrier concentration metal oxide semiconductor active layer with a band gap and spaced apart source/drain metal contacts in a thin film transistor configuration. The spaced apart source/drain metal contacts define a channel region in the active layer. Portions of the metal oxide semiconductor active layer in contact with the source/drain metal contacts have a carrier concentration greater than a carrier concentration in the channel region.

Alternatively or in addition to the above embodiment, a metal to metal oxide low resistance ohmic contact in a metal oxide semiconductor thin film transistor includes source/drain metal contacts with a very thin layer of low work function metal positioned on the metal oxide semiconductor active layer, the work function of the low work function metal being one of equal to and lower than a work function of the metal oxide semiconductor active layer, and a barrier layer of high work function metal positioned on the low work function metal, the work function of the high work function metal being one of equal to and greater than the work function of the metal oxide semiconductor active layer. Alternatively the layers of low work function metal and high work function metal can be replaced with a single layer in which the low work function metal and high work function metal are mixed in a sort of alloy.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
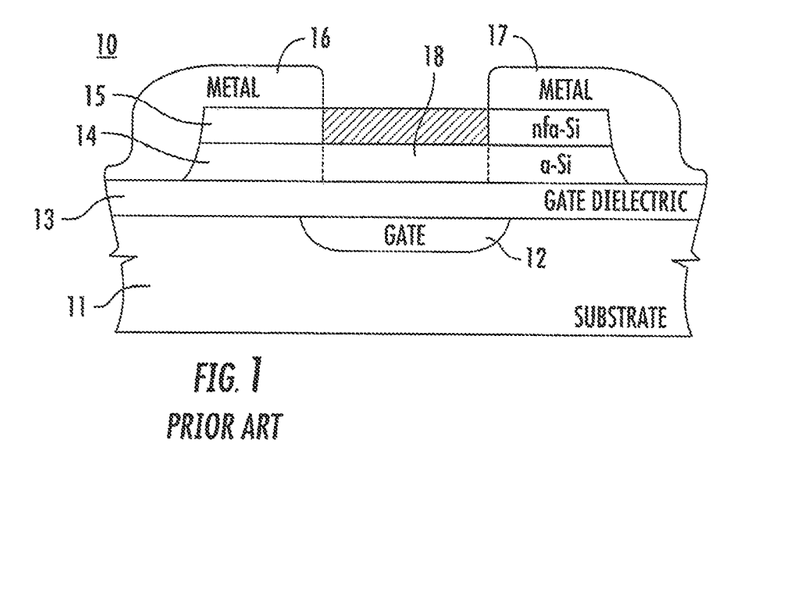
FIG. 1 is a simplified layer diagram of a typical a-Si TFT with ohmic source-drain contacts.

Turning now to FIG. 1, a simplified layer diagram of a typical a-Si TFT 10 with ohmic source-drain contacts is illustrated. TFT 10 includes a substrate 11 having a gate 12 formed in the upper surface thereof. Gate 12 is covered by a thin layer 13 of gate dielectric in a well known fashion. A layer 14 of undoped amorphous silicon (a-Si) is formed on the upper surface of gate dielectric layer 13 in any well known fashion. A layer 15 of heavily doped (n+) amorphous silicon is deposited on the upper surface of layer 14. Metal contacts 16 and 17, for the source and drain, respectively, are then formed on heavily doped layer 15 defining a channel area 18 (lying within the broken lines) in a-Si layer 14 between contacts 16 and 17. The portion of heavily doped layer 15 over channel area 18 can then be etched away, generally using metal contacts 16 and 17 as a mask. The low mobility in a-Si TFT channel 18 makes device 10 less demanding on contact resistance. Metal contacts 16 and 17 formed on highly doped layer 15 provide a low resistance (ohmic) contact.

One problem with the type of device illustrated in FIG. 1 is the etching of the portion of heavily doped layer 15 above the channel. It is very difficult to control the etching sufficiently to only remove layer 15 without etching into semiconductor layer 14 and causing difficulties, such as passivation, field effect control, instability, traps, etc. The equipment used to perform such processes over large glass size (extensive substrate area) is also extremely expensive for its complexity of uniform control.

There is a strong interest in metal oxide semiconductor material because of its high carrier mobility, light transparency and low deposition temperature. The high carrier mobility expands applications to higher performance domains that require higher frequency or higher current. The light transparency eliminates the need for a light shield in display and sensor active matrices. The low deposition temperature enables application to flexible electronics on plastic substrates.

The unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. Traditionally, the volume carrier density or concentration in metal oxide is controlled by oxygen vacancies. The oxygen vacancies can be controlled by: (a) partial pressure of oxygen during the deposition; (b) high temperature treatment; and (c) valence doping.

In metal oxide thin film transistors (MOTFT) the metal contacts are formed directly on the metal oxide semiconductor layer. That is the metal oxide semiconductor material is the same under the metal contacts as it is in the channel area. For MOTFTs the lack of an $n^+$ layer and a larger bandgap make it harder to provide a good ohmic contact. Furthermore, the high mobility of the metal oxide semiconductor material demands a lower contact resistance than that in a-Si TFTs. Without a good ohmic contact, the high mobility of the metal oxide semiconductor material can be masked by the contact resistance.

In the prior art, the source and drain contacts in a MOTFT are usually the Schottky barrier type where metal is in direct contact with metal oxide semiconductor material. Generally, stable contact metals (e.g. Mo, W, Au, Pt, Ag, etc.) have a relatively high work function while metals with a low work function (e.g. Al, Mg, Ti, Ta, Zn, In, V, Hf, Y, etc.) are unstable or oxidize relatively easily. The high work function metals form a Schottky barrier with metal oxide semiconductor material and to provide conduction, carriers must tunnel through the barrier. If the barrier is thin tunneling can occur with only a small amount of resistance but if the barrier is thick tunneling may be nearly prevented. In either case the Schottky barrier contact is not as desirable as an ohmic contact with a low resistance.

Figure 2:
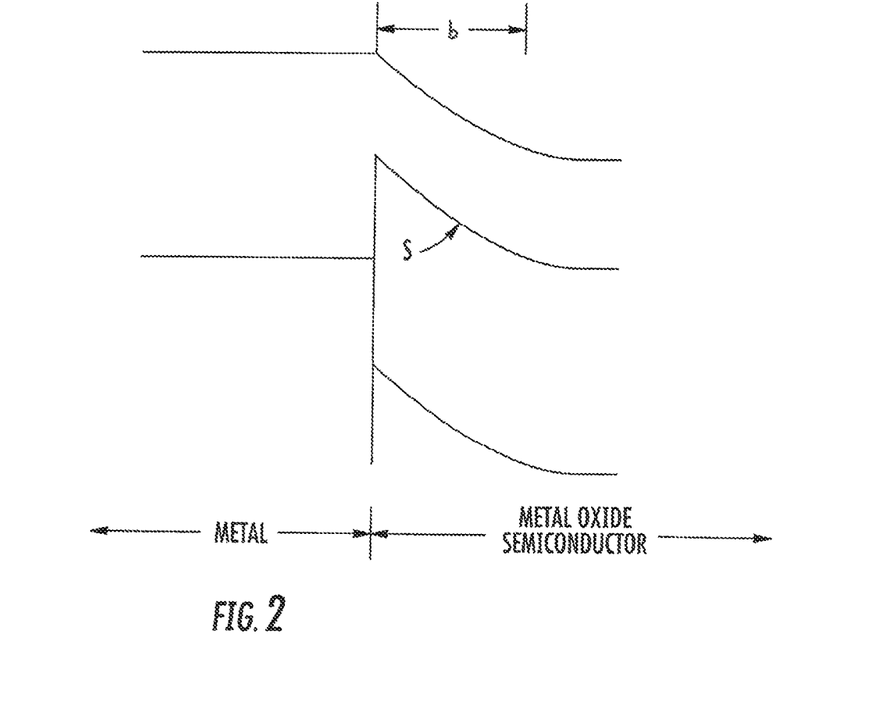
FIG. 2 is a simplified energy band diagram illustrating a Schottky barrier type contact between high work function metal and metal oxide semiconductor material.

Referring specifically to FIG. 2 a simplified energy band diagram illustrating a Schottky barrier type contact is illustrated. The contact is between a high work function metal, illustrated on the left, and metal oxide semiconductor material illustrated on the right. It can be seen that because of the difference in work functions a barrier is formed to the flow of electrons from the metal to the metal oxide semiconductor material. The thickness 'b' of the barrier determines the amount of conduction within the junction. That is, if the thickness b of the barrier is small enough, electrons can tunnel through and conduction will occur. The thickness b is controlled or determined primarily by the slope 's' of the barrier. The slope s is proportional to the carrier concentration in the metal oxide. It is understood that as the slope increases, i.e. the carrier concentration increases, the thickness b becomes smaller. For example, in FIG. 2 the slope is approximately 60°. As the slope is increased toward 90° thickness b becomes smaller. Thus, an increase in carrier concentration at the metal to semiconductor interface reduces the barrier thickness and improves the contact.

The term "work function" of a metal or a doped semiconductor refers to an energy level, e.g. in the energy diagram, FIG. 2, in which the electronic states are unoccupied, while at which or below which the electronic states are fully occupied.

The electronic states are, sometimes, also referred to as "Fermi energy" in the literature. In metal oxide semiconductor films used for TFT applications, the work function of the metal oxide semiconductor is very close to the bottom of the conduction band (as sketched in FIG. 2).

Generally, there are two ways or methods to make a good ohmic contact between the metal oxide semiconductor material and the metal: 1) the carrier concentration of the metal oxide semiconductor at the interface should be as high as possible (i.e. increase the slope of the barrier and reduce the thickness); and/or 2) the work function of the metal should substantially match the work function of the metal oxide semiconductor so there is little or no barrier. However, each of these methods has serious problems that must be overcome.

To use the first method, there is a dilemma in the device design. The problem is that the same high carrier concentration (e.g. >1E18/cm3) metal oxide semiconductor material lies under the source and drain contacts as appears in the TFT channel. For the TFT to operate properly, the channel carrier concentration cannot be too high (e.g. <1E18/cm3). Therefore, different carrier densities or concentrations must be created in different regions of the active or channel layer (metal oxide semiconductor layer) of the TFT.

Figure 3:
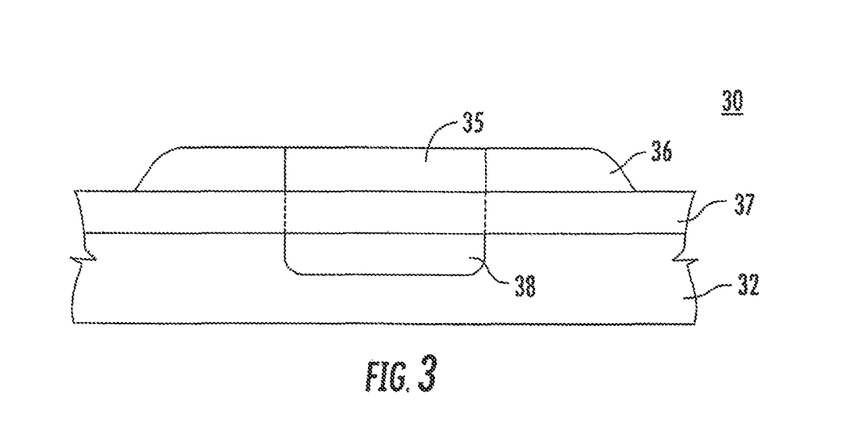
FIG. 3 is a simplified layer diagram illustrating an initial structure in a first method of forming an active layer with different carrier densities in accordance with the present invention.
Figure 4:
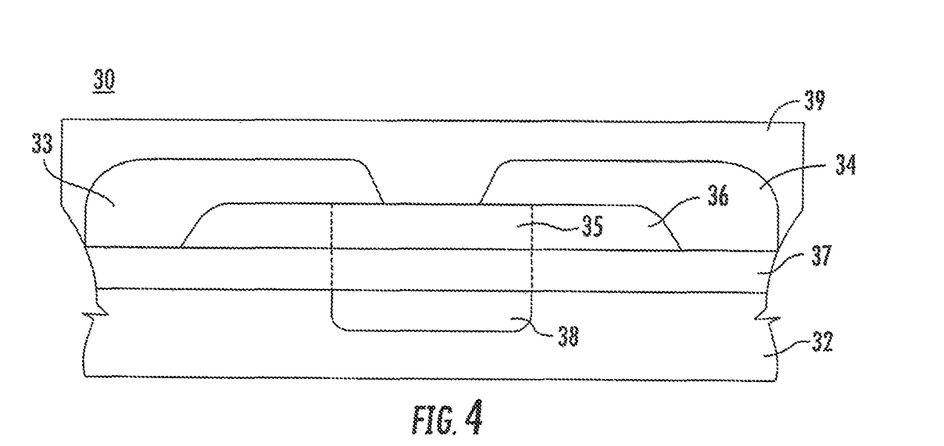
FIG. 4 is a simplified layer diagram, similar to FIG. 3, illustrating a final step in the first method of forming an active layer with different carrier densities.

Two methods of achieving different carrier densities or concentrations in the active or channel layer are provided in accordance with the present invention. A first method of forming an active layer with different carrier densities, illustrated in FIGS. 3 and 4 is as follows. Referring specifically to FIG. 3 an initial structure for fabricating a MOTFT 30 with underlying gate 38 and overlying source/drain 33 and 34, respectively, is illustrated. Here it will be understood that it is believed that any of the various possible MOTFT configurations could be adapted to one or all of the disclosed methods including for example a bottom gate, bottom source/drain type of device, a top gate, top source/drain type of device, a top gate, bottom source/drain type of device, etc. TFT 30 includes a substrate 32, which may be a flexible material, such as plastic, or any other convenient material, such as glass, etc. A gate metal electrode 38 is formed in substrate 32 by any convenient and established method. A thin gate dielectric layer 37 is formed in overlying relationship to gate metal electrode 38 and the surrounding areas of substrate 32. A metal oxide semiconductor film 36 is formed or patterned on gate dielectric layer 37 in overlying relationship to gate metal electrode 38 and the surrounding area. Metal oxide semiconductor film 36, which is the active layer of MOTFET 30, is a high carrier concentration metal oxide to make sure that a good ohmic contact is formed between source and drain (FIG. 4) and film 36.

Generally, the first method of forming an active layer with different carrier densities includes the following steps. First, the gate metal is defined (gate 38) and the gate dielectric is deposited (layer 37). Layer or film 36 of metal oxide semiconductor material is deposited and/or patterned. The deposition is done with no-oxidizing ambience so as to increase the carrier concentration. Substrate 32 can be optionally treated at high temperatures (if allowed by the choice of substrate material) in reducing ambience to further increase the carrier concentration. In the preferred method of heating, the whole structure of FIG. 3 is then subjected to blanket light illumination from a radiation source (e.g., radiation from a lamp or a pulsed laser), with photon energy below the bandgap of metal oxide layer 36 (e.g. 3 eV), gate dielectric layer 37 (e.g. >4 eV), and substrate 32 (e.g. >3 eV) in an oxidizing ambience, hereinafter referred to as "annealing". For additional information on the annealing process refer to copending United States patent application entitled "Laser Annealing of Metal Oxide Semiconductor on Temperature Sensitive Substrate Formations", Ser. No. 12/874,145, filed 1 Sep. 2010 and incorporated herein by reference. It should be understood that other methods of heating the channel region may be employed if desired or convenient.

As explained in the above cited copending application, all of the materials other than the gate metal are transparent to the laser light. Thus, the only material that can absorb the light (heat or energy) is gate metal 38. The laser pulse duration is chosen so that the temperature gradient is very large. That is, the temperature drops very rapidly from near the absorbed region, gate 38 (e.g. >100 Deg. C. in one micron). Therefore, only the channel region, designated 35, on top of gate 38 is heated up and its carrier density or concentration is reduced by the oxygen ambience (i.e., an environment comprising oxygen). The remainder of metal oxide semiconductor film 36 is prevented from reduction in carrier concentration by being at lower temperature even though it is in the oxygen ambience. Thus, channel region 35 is self-aligned with gate 38 and alignment of the etch stop and the source/drain metal 33 and 34, respectively, to the gate metal 38 becomes less critical.

Referring additionally to FIG. 4, source 33 and a drain 34 are formed partially in overlying relationship on the upper surface of metal oxide semiconductor film 36 so as to define a space therebetween on the upper surface overlying gate metal electrode 38. An optional passivation layer 39 is formed over the exposed portion of metal oxide film 36 and the surrounding portions of source 33 and drain 34. Because of the different carrier densities in active layer 36, a good metal to semiconductor contact (substantially an ohmic contact or a very high slope on the barrier) is formed at the interface between source 33 and film 36 and at the interface between drain 34 and film 36.

Figure 5:
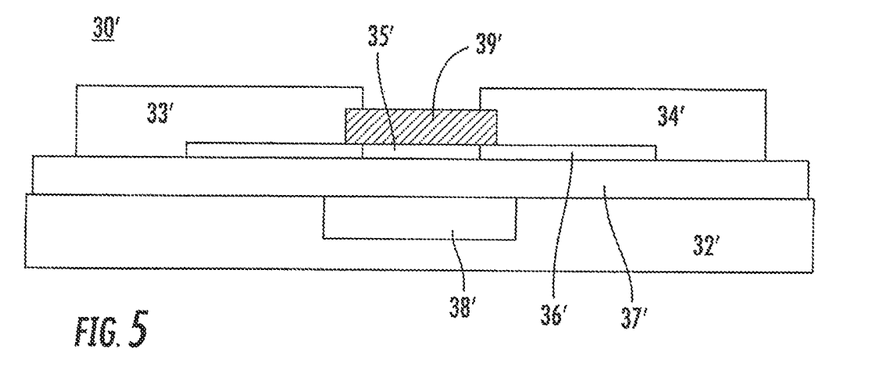
FIG. 5 is a simplified layer diagram of a MOTFT in accordance with the present invention with underlying gate and overlying source/drain illustrating a second method of forming an active layer with different carrier densities in accordance with the present invention.

The second method of providing different carrier densities or concentrations in different regions of the channel layer of a TFT is described in conjunction with FIG. 5, which illustrates a simplified layer diagram of a MOTFT 30' in accordance with the present invention with underlying gate 38' and overlying source/drain 33' and 34' respectively. Here it will be understood that it is believed that any of the various possible MOTFT configurations could be adapted to one or all of the disclosed methods including for example a bottom gate, bottom source/drain type of device, a top gate, top source/drain type of device, a top gate, bottom source/drain type of device, etc. TFT 30' includes a substrate 32', which may be a flexible material, such as plastic, or any other convenient material, such as glass, etc. A gate metal electrode 38' is formed in substrate 32' by any convenient and established method. A thin gate dielectric layer 37' is formed in overlying relationship to gate metal electrode 38' and the surrounding areas of substrate 32'. A metal oxide semiconductor film 36' is formed on gate dielectric layer 37' in overlying relationship to gate metal electrode 38' and the surrounding area. A source 33' and a drain 34' are formed partially in overlying relationship on the upper surface of metal oxide semiconductor film 36' so as to define a space therebetween on the upper surface overlying gate metal electrode 38'. Metal oxide semiconductor film 36', which is the active layer of MOTFET 30', is a high carrier concentration metal oxide to make sure that a good ohmic contact is formed between source 33' and film 36' and between drain 34' and film 36'. An optional passivation layer 39' is formed over the exposed portion of metal oxide film 36' and the surrounding portions of source 33' and drain 34'.

In the method of heating for this process, the whole structure of FIG. 5 is then subjected to heat in an oxidizing ambience, hereinafter referred to as "annealing". If optional passivation layer 39' is not present, the exposed portion, designated 35', of metal oxide film 36' between source 33' and drain 34' is subjected to the oxidizing ambience in the heating process and the carrier density or concentration is reduced by the oxidizing ambience. The remainder of metal oxide semiconductor film 36' is prevented from reduction in carrier concentration by being shielded or protected by source and drain 33' and 34' even though it is in the oxidizing ambience. Thus, channel region 35' is self-aligned with source/drain metal 33' and 34', respectively. Thus, source and drain 33' and 34' were applied when the carrier density or concentration of film 36' was high the metal to semiconductor contact is good (substantially an ohmic contact or a very high slope on the barrier) and the carrier density or concentration is reduced in channel 35' by subsequent heating.

It should be noted that several possible steps involving optional passivation layer 39' can be incorporated into the method at (or prior to) the point of heating the structure in the oxidizing ambience. For example, the metal oxide semiconductor channel material can be protected between the source and the drain (region 35') by an insulating etch stop (passivation) layer 39' during the source/drain metal etching process. After source/drain metal deposition and patterning, the source/drain metal 33' and 34' is in contact with the metal oxide semiconductor film 36'. Etch stop layer 39' can either stay as passivation material or be removed. If layer 39' is removed the channel region, designated 35', on top of gate 38' is heated up and its carrier concentration is reduced by the oxidizing ambience.

In a slightly different process, if it is desired to retain layer 39' as a passivation layer then an insulating material is chosen with the following characteristics. Layer 39' provides an etching stopper and channel protection function when patterning source and drain electrodes 33' and 34' with wet-etching or dry-etching as desired. Layer 39' is of insulating property with a large bulk resistance and a large surface resistance and should not create or allow a conducting path during the operation of MOTFT 30' under a reverse bias. Finally, the material of layer 39' behaves as a chemical barrier to $O_2$, $H_2O$, $H_2$, $N_2$, etc. during temperatures used for practical or normal operation (e.g. below 120° C.) but functions as an oxygen conductor at or above an annealing temperature (e.g. above 150° C.). It should be understood in conjunction with the above described process that a post annealing process, after source/drain pattern forming procedures, provides ohmic contacts between source-channel and drain-channel as well as providing oxygen atoms for the channel to reach the preferred carrier density.

Some examples of insulating materials that display the above described characteristics for passivation layer 39' include a layer that is formed with insulating material that has a glass transition temperature (Tg) below which the layer functions as a chemical barrier to $O_2$, $H_2O$, $H_2$, $N_2$, etc. and to chemicals used in following processes above it, and above which the layer behaves as semi-liquid with high viscosity but with sufficient mobility to oxygen, hydrogen, and/or nitrogen atoms. Some specific inorganic examples of such material include so called "liquid glass" material, sold by several companies including Dow-Corning (photo-patternable spin-on or printable silicones, e.g., WL5150, WL-3010, Degussa, etc. Some specific organic examples include the class of thermal-plastics such as polycarbonate (PC), polyethylene (PE), Polymethyl methacrylate (PMMA), Polymethylglutarimide (PMGI), or other acrylic polymers, polyimide (PI), polystyrene (PS), polyethylene oxide (PEO), polyvinyl oxide (PVA), epoxy, poly- or organosillanes and poly- or organosiloxanes such as polydimethylsiloxane (PDMS) or other types of liquid glasses or thermoplastic known to the experts in the field. In some cases, such as the structure shown in FIG. 5, it is preferable to select a material in photo-patternable form to simplify the patterning process.

Figure 7:
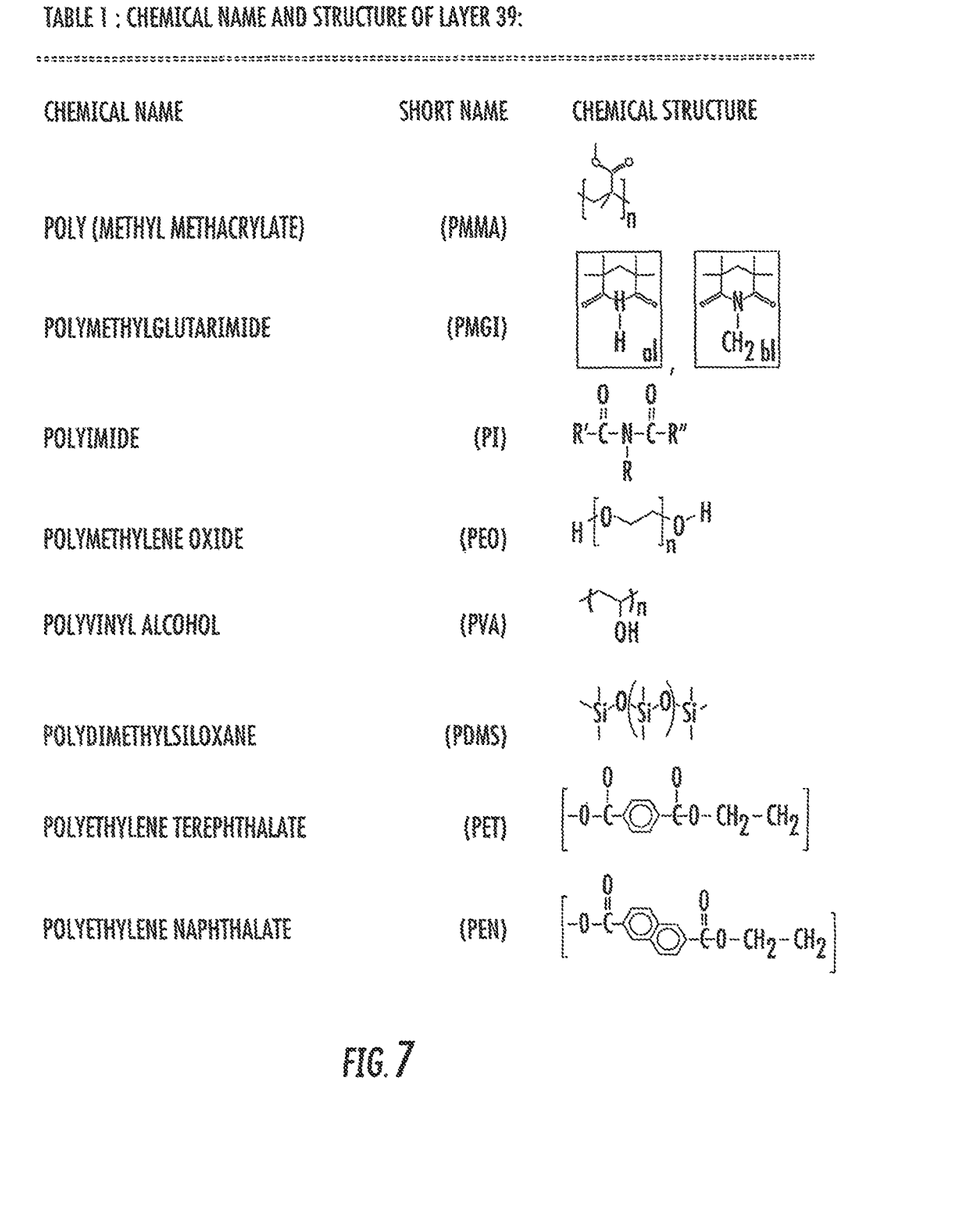
FIG. 7 illustrates Table 1 which shows the chemical structures of several of the materials that can be used in the invention.

Table 1 shows the chemical structures of several of the materials listed above. It should be noted that many of the listed materials include chemical groups: —O—, —COOH, —C═O, —O—O—, O═C—N—C═O, —C—OH, —C—H, etc. Materials with such oxygen-contained groups not only provide the path for oxygen hydrogen, and nitrogen ambience to the channel area at annealing temperature above Tg, but also provide oxygen and interact actively with the metal oxide semiconductor channel layer underneath; reduce traps at the interface, and improves the annealing effect and efficiency.

The above heating/oxidizing process can also include providing oxygen atoms for the channel to reach the preferred carrier density by embedding the atomic source in layer 39'. For example a composite material comprising a polymer binder with metal-oxide nanoparticles can be included in layer 39'. Examples of the binder materials include the glassy or thermal-polymeric materials disclosed above. Examples of the compound nanoparticles include metal-oxide, metal sulfide, etc. with energy gaps typically larger than 3.1 eV, e.g. $TiO_2$, $Ta_2O_5$, SrO, $SrTiO_3$, $Al_2O_3$, AlN $SiO_2$, etc. Such a layer can also be formed with a class of materials categorized as organo-metallic compounds of which an organo-metallic precursor material is used to form a patterned etch stop layer with the ending layer in either organo-metallic compound form, or organic/inorganic hybrid form. Examples of such materials include photochemical metal-organic deposition (PMOD) materials known to the experts in the field, and composite material with an organic binder and inorganic compound nanoparticles known to experts in the sol-gel processing field.

In one specific example, MOTFT 30' is fabricated on a glass substrate, and the Tg of etch stop layer 39' is in a range of approximately 220° C. to 320° C. The annealing temperature is selected to be approximately 30° C. to 70° C. above the Tg of passivation layer 39'.

In another specific example, MOTFT 30' is fabricated on a plastic substrate 32' with a Tg in a range of approximately 150° C. (for PET) to 390° C. (for polyimide). The Tg of etch stop (passivation) layer 39' is selected to be approximately 30° C. to 70° C. below the Tg of substrate 32' and the annealing temperature is selected equal to or below the Tg of substrate 32'.

In other specific embodiments etch stop (passivation) layer 39' is formed of photo patternable materials so that defining the channel length to micron levels can be achieved, the material of etch stop (passivation) layer 39' is formed with one of several liquid process methods known to experts in printing/dispensing field.

In certain specific applications, additional passivation layers can be formed or deposited on top of layer 39' of FIG. 5 or even on top of layer 39 of FIG. 4. Materials with good chemical barrier properties and good electric insulation could be used. Inorganic examples include $SiO_2$, SiN, $Al_2O_3$, AlN $Ta_2O_5$, etc. Organic examples include those listed above for layer 39'. Commercial photoresists used in the device and display industry for planarization or for passivation are preferable for their patterning simplicity.

Such additional passivation layer or layers can also be formed in organic/inorganic hybrids in either stack form or blend form. For the layer or layers made with inorganic material, the layer can be formed with one of vacuum deposition method such as sputtering or CVD. The layer can also be formed with one of the many coating techniques with a liquid precursor. A method of forming an organic/inorganic hybrid in a blend form has been disclosed in U.S. Pat. No. 7,790,237 by the same company as the present invention.

In each of the above instances, the treatment is designed to produce an oxygen rich environment that can reduce the carrier concentration only in the channel area while leaving the carrier concentration high in the contact areas, by using the source/drain metal as an oxygen barrier, so that a good ohmic contact is produced.

To use the second method of the two ways or methods to make a good ohmic contact between the metal oxide semiconductor material and the metal (i.e. substantially matching the work function of the metal to the work function of the metal oxide semiconductor) there is also a dilemma in the device design. In the work function matching method one problem is that a low work function metal that is lower or substantially matches the work function of the metal oxide semiconductor is very unstable and relatively quickly absorbs oxygen from the metal oxide. Thus, the contact metal becomes a poor conductor or insulating metal oxide at the interface and increases the contact resistance. A high work function stable metal generally has a work function much higher than the metal oxide semiconductor work function so that the junction becomes a Schottky barrier junction instead of a low resistance ohmic contact.

Figure 6:
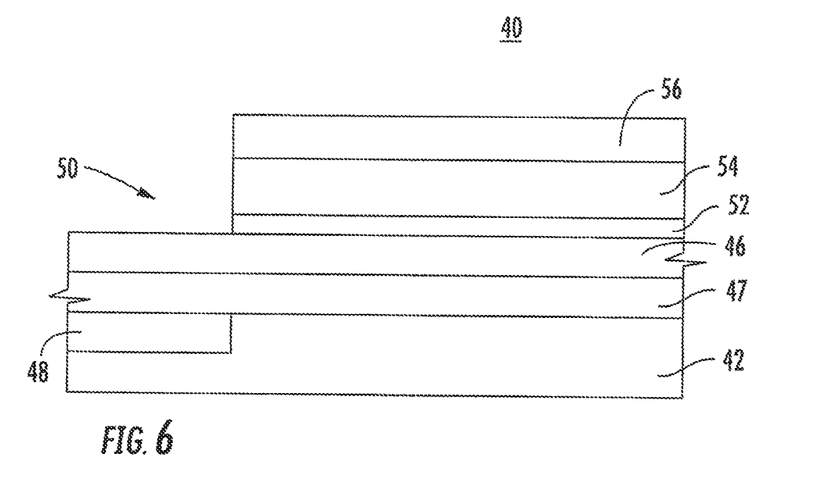
FIG. 6 is simplified layer diagram of a partial MOTFT illustrating an ohmic metal contact in accordance with the present invention.

A preferred way of solving this dilemma is illustrated in the simplified layer diagram of a partial MOTFT 40 showing an ohmic metal contact 50 in accordance with the present invention. MOTFT 40 includes a substrate 42 with a gate metal electrode 48 formed therein. A thin layer 47 of gate dielectric is formed over gate metal electrode 48 and at least partially over the upper surface of substrate 42. A layer 46 of metal oxide semiconductor material is formed or patterned on the surface of layer 47, generally as described above in conjunction with FIG. 5. A metal to metal oxide semiconductor ohmic contact, generally designated 50 is formed on the upper surface of metal oxide semiconductor layer 46. Here it will be understood that while a typical underlying gate and overlying source/drain type of MOTFT is illustrated, it is believed that any of the various possible MOTFT configurations could be adapted to the disclosed method including for example a bottom gate, bottom source/drain type of device, a top gate, top source/drain type of device, a top gate, bottom source/drain type of device, etc.

It will be understood that typical metal oxide semiconductor materials described in this disclosure generally include at least one of zinc oxide, indium oxide, tin oxide, gallium oxide, cadmium oxide, or any combinations thereof. The typical work function of metal oxide semiconductor layer 46 is around 4 eV. For metals with work functions less than 4 eV, there is a strong tendency to form their metal oxides, which are very poor conductors. Some typical examples of low work function metals include Al, Mg, Ti, Ta, and combinations thereof, etc. Generally, the lower the work function, the less conductive their oxide tends to be, e.g. Mg has a work function of 3.5 eV, Al has a work function of 3.7 eV, and magnesium oxide and aluminum oxide are both relatively good insulators.

Metal to metal oxide semiconductor ohmic contact 50 is a multiple metal contact that essentially solves the problem expressed above. A first very thin layer 52 of low work function metal is deposited on the surface of metal oxide semiconductor layer 46 to form a low resistance ohmic contact. Layer 52 is less than 5 nm thick and preferably less than 1 nm thick. A barrier layer 54 is deposited over layer 52 with a thickness greater than 10 nm and preferably greater than 50 nm. Examples of barrier metals that can be used include Mo, W, Au, Pt, Ag, and combinations thereof, etc. Generally, the barrier metals have a high work function (e.g. 4.5 eV and greater) and are thus relatively stable metals. An optional bulk layer 56 of highly conductive contact metal, such as aluminum and copper, may be added on top of barrier layer 54 if desired.

Thus, in the operation of metal to metal oxide semiconductor ohmic contact 50, initially the very thin layer 52 of low work function metal forms an ohmic contact with metal oxide semiconductor layer 46. Because the low work function metal is unstable, oxygen from metal oxide semiconductor layer 46 relatively rapidly oxidizes it. The barrier metal layer of high work function metals is included to block the further migration of oxygen from metal oxide semiconductor layer 46 into contact metal layer 56. However, layer 52 is so thin the amount of metal oxide accumulated from the oxidizing thereof has little or no effect on conduction of contact 50. Further, the methods combine to the extent that during the exposure of metal oxide semiconductor layer 46 to an oxidizing ambience at high temperature, the metal oxide semiconductor layer 46 under contact area 50 will become very conductive because the loss of oxygen due to migration of the oxygen into the low work function metal layer 52 further improves the ohmic contact, i.e. forms different carrier densities or concentrations in different regions of the channel layer.

In a slightly different embodiment, very small amounts of the low work function metal are alloyed or mixed into the metal of barrier layer 54, rather than forming a separate layer 52. Such an alloy or mixture still provides a low work function and good ohmic contact with the metal oxide semiconductor layer. An example of using such a low work function alloy, Mg—Ag, for the cathode in an organic light emitting diode was demonstrated by Kodak (C. W. Tang et al., *Applied Phys. Letters* 51, 913 (1987)), effective electron injection from the alloy cathode into organic semiconductor Alq layer, was achieved.

In this embodiment, the low work function metal in the alloy adjacent the contact surface of metal oxide semiconductor material absorbs oxygen from the metal oxide semiconductor material (oxidizes), thus raising the carrier density or concentration and improving the metal to semiconductor contact. Since only a small amount of low work function metal is present the oxidation has little effect on the contact. Also, unoxidized low work function material is shielded by the barrier metal so it has little effect on the contact.

The present invention provides new and improved low resistance ohmic source/drain metal contacts in a MOTFT. The improved source/drain metal contacts in a MOTFT form a low resistance ohmic contact that has not been previously readily achievable. Further, the improved source/drain metal contacts in a MOTFT are relatively easy and inexpensive to fabricate. It will be readily understood that either the processes of treating the channel region in an oxygen rich environment that reduces the carrier concentration only in the channel area while leaving the carrier concentration high in the contact areas (i.e. providing different carrier densities or concentrations in different regions of the channel layer) or the process of forming a multiple metal contact can be used separately or in combination if desired. The structure and the corresponding fabrication methods for the MOTFTs disclosed herein, in fact, provide an effective way of forming zones in the metal oxide semiconductor layer with distinct carrier concentrations.

Various changes and modifications to the embodiment herein chosen for purposes of illustration will readily occur to those skilled in the art. For example, in a MOTFT with bottom source/drain, a metal oxide semiconductor active layer with the desired carrier concentration zones can be formed by starting from an active layer with the carrier density optimized for the channel region (e.g., <$10^{17}$ carriers cm$^{-3}$), with similar annealing procedures disclosed herein, such as with a radiation light source from the top and under an ambient without oxygen (e.g., in a vacuum or under $N_2$ or Ar gas), one can increase oxygen vacancies on top of the source and drain contact pads and increase the carrier concentration to greater than $10^{17}$ cm$^{-3}$. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A metal to metal oxide low resistance ohmic contact in a metal oxide semiconductor thin film transistor comprising:
   a gate, a gate dielectric, a high carrier concentration metal oxide semiconductor active layer with a band gap and spaced apart source/drain metal contacts in a thin film transistor configuration, the spaced apart source/drain metal contacts defining a channel region in the active layer;
   a passivation layer positioned in overlying relationship on the channel region of the metal oxide semiconductor active layer, the passivation layer being formed with insulating material that has a glass transition temperature (Tg), below the Tg the insulating material functions as a chemical barrier to $O_2$, $H_2O$, $H_2$, $N_2$, and to chemicals used in following fabrication processes above the passivation layer, and above the Tg the insulating material behaves as semi-liquid with high viscosity and with sufficient mobility to oxygen, hydrogen, and nitrogen atoms; and
   portions of the metal oxide semiconductor active layer in contact with the source/drain metal contacts having a carrier concentration greater than a carrier concentration in the channel region.

2. The metal to metal oxide low resistance ohmic contact in a metal oxide semiconductor thin film transistor as claimed in claim 1 wherein the carrier concentration in the portions of the metal oxide semiconductor active layer in contact with the source/drain metal contacts is greater than approximately 1E18/cm3.

3. The metal to metal oxide low resistance ohmic contact in a metal oxide semiconductor thin film transistor as claimed in claim 2 wherein the carrier concentration in the channel region of the metal oxide semiconductor active layer is reduced to less than 1E18/cm3.

4. The metal to metal oxide low resistance ohmic contact in a metal oxide semiconductor thin film transistor as claimed in claim 1 wherein each of the source/drain metal contacts has a first portion including a low work function metal and a high work function barrier metal, the work function of the low work function metal being one of equal to and lower than a work function of the metal oxide semiconductor active layer, and the work function of the barrier material being one of equal to and greater than the work function of the metal oxide semiconductor active layer, the first portion being positioned on the metal oxide semiconductor active layer, and a second portion of conductive metal positioned on the first portion.

5. The metal to metal oxide low resistance ohmic contact in a metal oxide semiconductor thin film transistor as claimed in claim 4 wherein the low work function metal and the high work function barrier metal are mixed in a single layer.

6. The metal to metal oxide low resistance ohmic contact in a metal oxide semiconductor thin film transistor as claimed in claim 4 wherein the low work function metal and the high work function barrier metal are each formed as a separate layer.

7. The metal to metal oxide low resistance ohmic contact in a metal oxide semiconductor thin film transistor as claimed in claim 1 further including source/drain metal contacts with a thin layer of low work function metal positioned on the metal oxide semiconductor active layer, the work function of the low work function metal being one of equal to and lower than a work function of the metal oxide semiconductor active layer, and a barrier layer of high work function metal positioned on the low work function metal, the work function of the high work function metal being one of equal to and greater than the work function of the metal oxide semiconductor active layer.

8. The metal to metal oxide low resistance ohmic contact in a metal oxide semiconductor thin film transistor as claimed in claim 7 where in the thin layer of low work function metal the work function is lower than a work function of approximately 4 eV.

9. The metal to metal oxide low resistance ohmic contact in a metal oxide semiconductor thin film transistor as claimed in claim 7 where in the barrier layer of high work function metal the work function is higher than a work function of approximately 4 eV.

10. The metal to metal oxide low resistance ohmic contact in a metal oxide semiconductor thin film transistor as claimed in claim 1 wherein the insulating material of the passivation layer includes one of an inorganic material including liquid glass material or silicones, including WL5150, WL-3010, or Degussa.

11. The metal to metal oxide low resistance ohmic contact in a metal oxide semiconductor thin film transistor as claimed in claim 10 wherein the inorganic material in the passivation layer comprises oxygen.

12. The metal to metal oxide low resistance ohmic contact in a metal oxide semiconductor thin film transistor as claimed in claim 10 wherein the inorganic material in the passivation layer comprises liquid glass material or silicones, including Dow Corning photopatternable WL5150, WL-3010, or Degussa's siloxane contained materials.

13. The metal to metal oxide low resistance ohmic contact in a metal oxide semiconductor thin film transistor as claimed in claim 1 wherein the insulating material of the passivation layer includes one of an organic material comprising at least one of the following chemical groups: —O—, —COOH, —C=O, —O—O—, O=C—N—C=O, —C—OH, and —C—H.

14. The metal to metal oxide low resistance ohmic contact in a metal oxide semiconductor thin film transistor as claimed in claim 1 wherein the insulating material of the passivation layer includes a composite material comprising an organic or inorganic polymer binder with compound nanoparticles.

15. The metal to metal oxide low resistance ohmic contact in a metal oxide semiconductor thin film transistor as claimed in claim 14 wherein the binder includes at least one of glassy or thermal polymer materials.

16. The metal to metal oxide low resistance ohmic contact in a metal oxide semiconductor thin film transistor as claimed in claim 14 wherein the compound nanoparticles include one of metal-oxides or metal sulfides with energy gaps larger than 3.1 eV.

17. The metal to metal oxide low resistance ohmic contact in a metal oxide semiconductor thin film transistor as claimed in claim 14 wherein the compound nanoparticles include one of $TiO_2$, $Ta_2O_5$, SrO, $SrTiO_3$, $Al_2O_3$, AlN, $SiO_2$ and their combinations.

18. The A metal to metal oxide low resistance ohmic contact in a metal oxide semiconductor thin film transistor as claimed in claim 1 wherein the insulating material of the passivation layer comprises at least one organo-metallic compound molecule.

19. The metal to metal oxide low resistance ohmic contact in a metal oxide semiconductor thin film transistor as claimed in claim 1 wherein the passivation layer is constructed to convey oxygen therethrough during a heating step to provide oxygen ambient.

20. The metal to metal oxide low resistance ohmic contact in a metal oxide semiconductor thin film transistor as claimed in claim 1 wherein the passivation layer includes material containing oxygen, the oxygen being released during a heating step, performed subsequent to the passivation layer being positioned in overlying relationship on the channel region of the metal oxide semiconductor active layer, to provide an oxygen ambient.

21. The metal to metal oxide low resistance ohmic contact in a metal oxide semiconductor thin film transistor as claimed in claim 1 wherein the passivation layer includes an etch stop material.

22. A metal to metal oxide low resistance ohmic contact in a metal oxide semiconductor thin film transistor comprising:
a gate, a gate dielectric, a high carrier concentration metal oxide semiconductor active layer with a band gap and spaced apart source/drain metal contacts in a thin film transistor configuration, the spaced apart source/drain metal contacts defining a channel region in the metal oxide semiconductor active layer;
a passivation layer positioned in overlying relationship on the channel region of the metal oxide semiconductor active layer, the passivation layer being formed with insulating material that has a glass transition temperature (Tg), below the Tg the insulating material functions as a chemical barrier to $O_2$, $H_2O$, $H_2$, $N_2$, and to chemicals used in following fabrication processes above the passivation layer, and above the Tg the insulating material behaves as semi-liquid with high viscosity and with sufficient mobility to oxygen, hydrogen, and nitrogen atoms;
each of the source/drain contacts including a thin layer of low work function metal positioned on the metal oxide semiconductor active layer, the work function of the low work function metal being one of equal to and lower than a work function of the metal oxide semiconductor active layer; and
each of the source/drain contacts including a barrier layer of high work function metal positioned on the low work function metal, the work function of the high work function metal being one of equal to and greater than the work function of the metal oxide semiconductor active layer.

23. The metal to metal oxide low resistance ohmic contact in a metal oxide semiconductor thin film transistor as claimed in claim 22 where in the thin layer of low work function metal the work function is lower than a work function of approximately 4 eV.

24. The metal to metal oxide low resistance ohmic contact in a metal oxide semiconductor thin film transistor as claimed in claim 22 where in the barrier layer of high work function metal the work function is higher than a work function of approximately 4 eV.

25. The metal to metal oxide low resistance ohmic contact in a metal oxide semiconductor thin film transistor as claimed in claim 22 wherein the spaced apart source/drain metal contacts define a channel region in the active layer, and portions of the metal oxide semiconductor active layer in contact with the source/drain metal contacts having a carrier concentration greater than a carrier concentration in the channel region.

26. The metal to metal oxide low resistance ohmic contact in a metal oxide semiconductor thin film transistor as claimed in claim 25 wherein the carrier concentration in the portions of the metal oxide semiconductor active layer in contact with the source/drain metal contacts is greater than approximately 1E18/cm3.

27. The metal to metal oxide low resistance ohmic contact in a metal oxide semiconductor thin film transistor as claimed in claim 25 wherein the carrier concentration in the channel region of the metal oxide semiconductor active layer is reduced to less than 1E18/cm3.

28. The metal to metal oxide low resistance ohmic contact in a metal oxide semiconductor thin film transistor as claimed in claim 22 wherein the thin layer of low work function metal has a thickness less than 5 nm.

29. The metal to metal oxide low resistance ohmic contact in a metal oxide semiconductor thin film transistor as claimed in claim 22 wherein the thin layer of low work function metal has a thickness less than 1 nm.

\* \* \* \* \*